(12) United States Patent
Chen et al.

(10) Patent No.: US 11,018,182 B2
(45) Date of Patent: May 25, 2021

(54) PIXEL STRUCTURE

(71) Applicant: Lextar Electronics Corporation, Hsinchu (TW)

(72) Inventors: Yi-Jyun Chen, Chiayi County (TW); Li-Cheng Yang, Taoyuan (TW); Yu-Chun Lee, Hsinchu County (TW); Shiou-Yi Kuo, Hsinchu (TW); Chih-Hao Lin, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 216 days.

(21) Appl. No.: 16/171,334

(22) Filed: Oct. 25, 2018

(65) Prior Publication Data

US 2019/0131342 A1    May 2, 2019

(30) Foreign Application Priority Data

Oct. 27, 2017    (CN) .......................... 201711020134.X

(51) Int. Cl.
*H01L 27/15*    (2006.01)
*H01L 33/50*    (2010.01)
(Continued)

(52) U.S. Cl.
CPC .......... *H01L 27/15* (2013.01); *H01L 25/0753* (2013.01); *H01L 27/156* (2013.01);
(Continued)

(58) Field of Classification Search
CPC ... H01L 27/15; H01L 27/156; H01L 25/0753; H01L 33/382; H01L 33/385;
(Continued)

(56) References Cited

U.S. PATENT DOCUMENTS

2014/0312368 A1    10/2014    Lee et al.
2015/0014716 A1*    1/2015    von Malm .............. H01L 27/15
257/89

(Continued)

FOREIGN PATENT DOCUMENTS

CN    105870284 A    8/2016
TW    201507212 A    2/2015
(Continued)

*Primary Examiner* — Sue A Purvis
*Assistant Examiner* — Scott Stowe
(74) *Attorney, Agent, or Firm* — CKC & Partners Co., LLC

(57) ABSTRACT

A pixel structure includes a light emitting diode chip and a light blocking structure. The light emitting diode chip includes a P-type semiconductor layer, an active layer, an N-type semiconductor layer, a first electrode, and K second electrodes. The active layer is located on the P-type semiconductor layer. The N-type semiconductor layer is located on the active layer. The N-type semiconductor layer has a first top surface that is distant from the active layer. The first electrode is electrically connected to the P-type semiconductor layer. The light blocking structure is located in the light emitting diode chip and defines K sub-pixel regions. The active layer and the N-type semiconductor layer are divided into K sub-portions respectively corresponding to the K sub-pixel regions by the light blocking structure. The K sub-pixel regions share the P-type semiconductor layer.

19 Claims, 5 Drawing Sheets

(51) Int. Cl.
    *H01L 25/075*     (2006.01)
    *H01L 33/08*     (2010.01)
    *H01L 33/52*     (2010.01)
    *H01L 33/38*     (2010.01)
    *H01L 33/58*     (2010.01)
    *H01L 33/46*     (2010.01)

(52) U.S. Cl.
    CPC .............. *H01L 33/08* (2013.01); *H01L 33/38* (2013.01); *H01L 33/504* (2013.01); *H01L 33/52* (2013.01); *H01L 33/58* (2013.01); *H01L 33/46* (2013.01)

(58) Field of Classification Search
    CPC ....... H01L 33/387; H01L 33/08; H01L 33/38; H01L 33/504; H01L 33/52; H01L 33/58
    See application file for complete search history.

(56) References Cited

U.S. PATENT DOCUMENTS

2015/0076456 A1     3/2015    Choi et al.
2017/0012026 A1     1/2017    Choi

FOREIGN PATENT DOCUMENTS

TW           I542045 B      7/2016
TW           I563490 B     12/2016

\* cited by examiner

10E

10F

10H

10G

10I

PIXEL STRUCTURE

CROSS-REFERENCE TO RELATED APPLICATION

This application claims priority to China Application Serial Number 201711020134.X, filed Oct. 27, 2017, which is herein incorporated by reference in its entirety.

BACKGROUND

Field of Invention

The present disclosure relates to a pixel structure of a display.

Description of Related Art

The technology of blue light emitting diode chip with phosphor to make white light emitting diode has almost completely replaced cold cathode fluorescent lamp (CCFL) in recent years due to its high color saturation, power saving, light weight, and the like. The white light emitting diode may be used in some applications, such as mobile phones, tablets, notebooks, desktop monitors, televisions, and the like.

However, the color saturation of the white light emitting diode is still not as good as the three primary colors light emitting diode. Therefore, a technique of directly utilizing the three primary colors light emitting diode as a display for self-emitting display of pixels is also being developed. Generally, RGB components use three chips to complete die bonding process, but there are many new problems and challenges in the process and optical efficiency, such as low chip cutting yield, chip reabsorption or tolerance of die bonding.

SUMMARY

The disclosure provides a pixel structure to solve the above problems.

According to one or more embodiments of the present disclosure, a pixel structure includes a light emitting diode chip and a light blocking structure. The light emitting diode chip includes a P-type semiconductor layer, an active layer, an N-type semiconductor layer, a first electrode, and K second electrodes, wherein K is a positive integer greater than or equal to 3. The active layer is located on the P-type semiconductor layer. The N-type semiconductor layer is located on the active layer. The N-type semiconductor layer has a first top surface that is distant from the active layer. The first electrode is electrically connected to the P-type semiconductor layer. The light blocking structure is located in the light emitting diode chip, and defines K sub-pixel regions. The active layer and the N-type semiconductor layer are divided into K sub-portions respectively corresponding to the K sub-pixel regions by the light blocking structure, and K sub-pixel regions share the P-type semiconductor layer. The K second electrodes are respectively electrically connected to the K sub-portions of N-type semiconductor layers. The first top surface is divided into K light emitting surfaces corresponding to the K sub-pixel regions by the light blocking structure.

According to one or more embodiments of the present disclosure, the P-type semiconductor layer has a first bottom surface that is distant from the first top surface, the active layer has a second bottom surface that is distant from the first top surface, and the light blocking structure has a third bottom surface between the first bottom surface and the second bottom surface.

According to one or more embodiments of the present disclosure, the light blocking structure further has a second top surface that is distant from the P-type semiconductor layer. The second top surface is not lower than the first top surface.

According to one or more embodiments of the present disclosure, the light blocking structure extends from the third bottom surface to the second top surface.

According to one or more embodiments of the present disclosure, the first electrode and the K second electrodes are present on one side of the light emitting diode chip relative to the first top surface.

According to one or more embodiments of the present disclosure, currents passing through the first electrode and any of the K second electrodes are the same.

According to one or more embodiments of the present disclosure, voltages between the first electrode and any of the K second electrodes are the same.

According to one or more embodiments of the present disclosure, the pixel structure further includes L wavelength transfer layers. The L wavelength transfer layers respectively located on the L light emitting surfaces of the K light emitting surfaces, wherein L is a positive integer less than or equal to K.

According to one or more embodiments of the present disclosure, at least two of the L wavelength transfer layers are excited to generate different emission bands.

According to one or more embodiments of the present disclosure, L is a positive integer less than K such that at least one of the K light emitting surfaces does not have any of the L wavelength transfer layers.

According to one or more embodiments of the present disclosure, the pixel structure further includes a transparent adhesive located on the light emitting surface that does not have any of the L wavelength transfer layers.

According to one or more embodiments of the present disclosure, the L wavelength transfer layers respectively have a vertical projection region on the L light emitting surfaces, and area of the vertical projection regions respectively correspond to area of the L light emitting surfaces.

According to one or more embodiments of the present disclosure, the pixel structure further includes at least one spacer located between the L wavelength transfer layers.

According to one or more embodiments of the present disclosure, the light blocking structure includes a first portion and a second portion. The first portion is embedded in the N-type semiconductor layer and the active layer under the first top surface. The second portion covers the first top surface to define at least L accommodating spaces, and the L wavelength transfer layers respectively located in the L accommodating spaces.

According to one or more embodiments of the present disclosure, the second portion protrudes above the first top surface.

According to one or more embodiments of the present disclosure, at least two of the K light emitting surfaces have different areas.

According to one or more embodiments of the present disclosure, the light blocking structure includes an insulating layer and a reflective layer.

According to one or more embodiments of the present disclosure, the reflective layer includes a white glue reflective material, and the white glue reflective material includes titanium dioxide, silicon dioxide, zinc oxide, boron nitride or combinations thereof.

According to one or more embodiments of the present disclosure, the reflective layer includes a metal reflective material, and the metal reflective material includes aluminum, silver, silver-plated copper, aluminum-plated copper or combinations thereof.

According to one or more embodiments of the present disclosure, the K sub-pixel regions are arranged in a strip form, a PenTile form, a rectangle form or a diamond form.

In summary, the pixel structure of the present disclosure is composed of a light emitting diode chip and a wavelength transfer layer. In contrast to the pixel structure of the conventional RGB multi-chip module, the pixel structure of the present disclosure is a single chip module which can improve the yield of chip cutting and die bonding, and also avoid the problem of light reabsorption between multiple chips.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
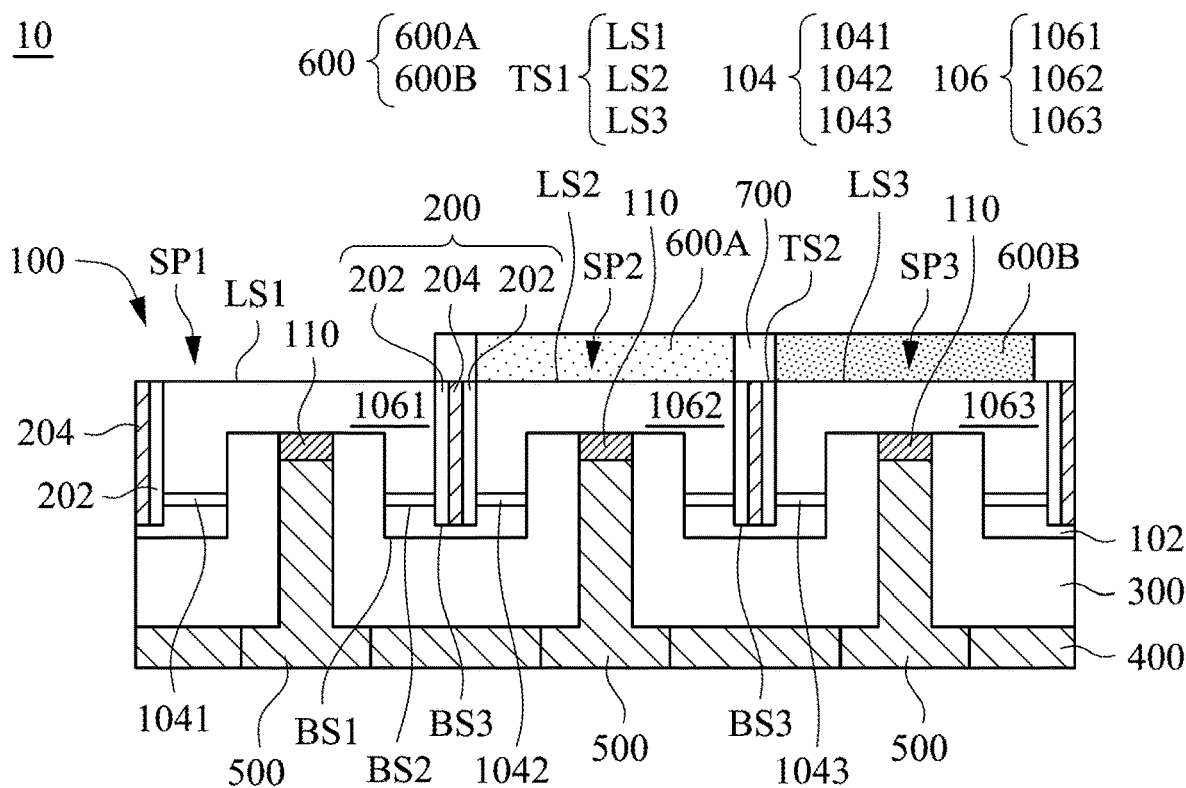
FIG. 1 is a front view of a pixel structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
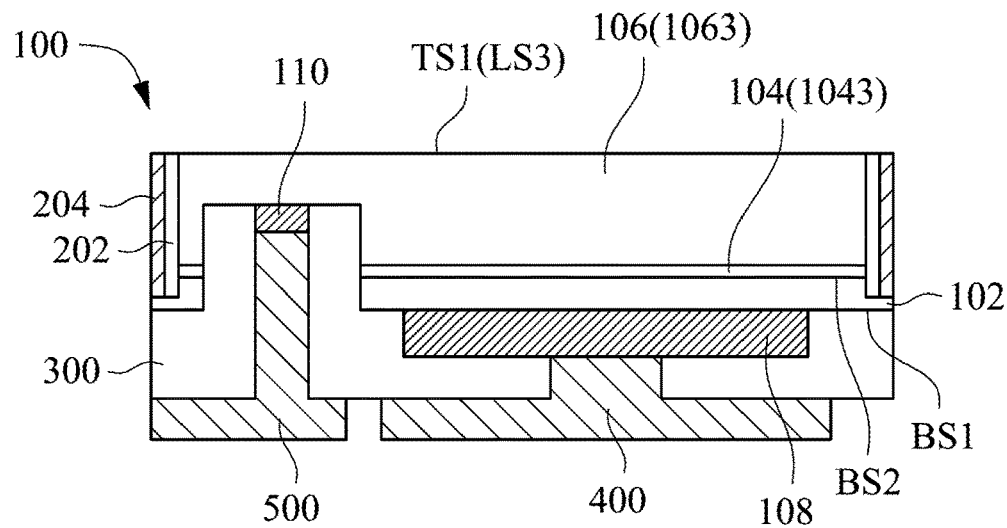
FIG. 2 is a side view of the pixel structure with wavelength transfer layer omitted as shown in FIG. 1.
Figure 3:
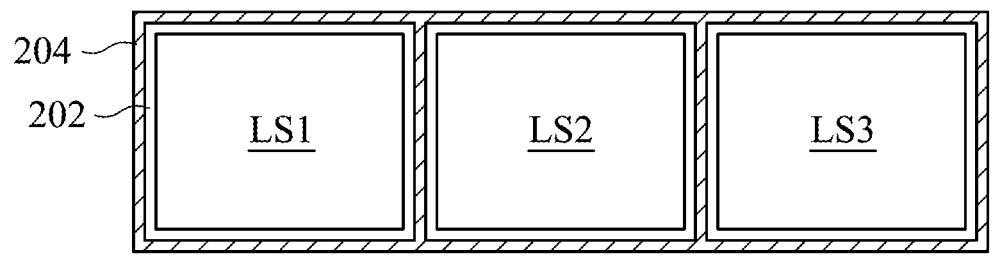
FIG. 3 is a top view of the pixel structure with wavelength transfer layer omitted as shown in FIG. 1.
Figure 4:
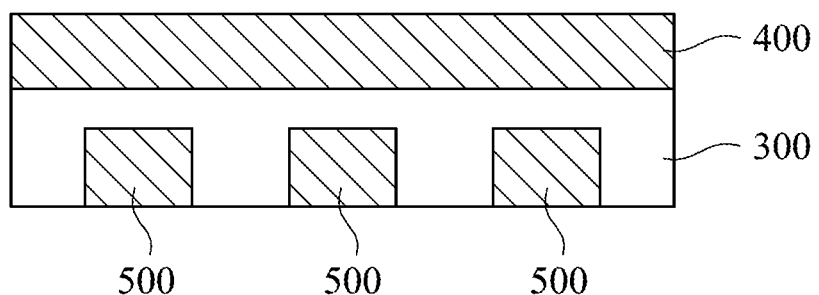
FIG. 4 is a bottom view of the pixel structure as shown in FIG. 1.

FIG. 1 is a front view of a pixel structure 10 in accordance with one embodiment of the present disclosure. FIG. 2 is a side view of the pixel structure 10 with wavelength transfer layer 600 omitted as shown in FIG. 1. FIG. 3 is a top view of the pixel structure 10 with wavelength transfer layer 600 omitted as shown in FIG. 1. FIG. 4 is a bottom view of the pixel structure 10 as shown in FIG. 1. First, as shown in FIGS. 1 to 3, in the present embodiment, the pixel structure 10 includes a light emitting diode chip 100 and a light blocking structure 200. The light emitting diode chip 100 includes a P-type semiconductor layer 102, an active layer 104, an N-type semiconductor layer 106, a first electrode 108, and K second electrodes 110, wherein K is a positive integer greater than or equal to 3. The active layer 104 is located on the P-type semiconductor layer 102. The N-type semiconductor layer 106 is located on the active layer 104, and the N-type semiconductor layer 106 has a first top surface TS1 that is distance from the active layer 104. The first electrode 108 is electrically connected to the P-type semiconductor layer 102. The light blocking structure 200 is located in the light emitting diode chip 100 and defines K sub-pixel regions. In the present embodiment, for example, k is equal to 3. That is, the light blocking structure 200 defines three sub-pixel regions SP1, SP2, and SP3. However, the present disclosure is not limited to any particular number of the sub-pixel regions. Those skilled in the art may flexibly select the number of the sub-pixel regions defined by the light blocking structure 200 based on actual needs.

The active layer 104 and the N-type semiconductor layer 106 are respectively divided into three sub-portions corresponding to, e.g., aligned with, the three sub-pixel regions SP1, SP2, and SP3 by the light blocking structure 200. In other words, the active layer 104 is divided into three sub-portions 1041, 1042, and 1043 respectively corresponding to, e.g., aligned with, the three sub-pixel regions SP1, SP2, and SP3 by the light blocking structure 200. Similarly, the N-type semiconductor layer 106 is also divided into three sub-portions 1061, 1062, and 1063 respectively corresponding to, e.g., aligned with, the three sub-pixel regions SP1, SP2, and SP3 by the light blocking structure 200. The three sub-pixel regions SP1, SP2, and SP3 share the P-type semiconductor layer 102 as a common electrode. The three second electrodes 110 of the light emitting diode chip 100 are electrically connected to the three sub-portions 1061, 1062, and 1063 of the N-type semiconductor layer 106, respectively. Moreover, the first top surface TS1 is divided into three light emitting surfaces LS1, LS2, and LS3 corresponding to, e.g., aligned with, the three sub-pixel regions SP1, SP2, and SP3 by the light blocking structure 200.

The P-type semiconductor layer 102 has a first bottom surface BS1 that is distant from the first top surface TS1, and the active layer 104 has a second bottom surface BS2 that is distant from the first top surface TS1. The light blocking structure 200 has a third bottom surface BS3 that is between the first bottom surface BS1 and the second bottom surface BS2, and a second top surface TS2 that is distant from the P-type semiconductor layer 102. The second top surface TS2 is not lower than, e.g., level with or higher than, the first top surface TS1, and the light blocking structure 200 extends from the third bottom surface BS3 to the second top surface TS2. In this way, any adjacent-two of the sub-pixel regions SP1, SP2, and SP3, from the light emitting surfaces LS1, LS2, and LS3 to the sub-portions 1041, 1042, and 1043 of the active layer 104, are isolated by the light blocking structure 200 such that the light emitted by different sub-pixel regions SP1, SP2, and SP3 can be ensured not to interfere with each other to achieve a better display.

As shown in FIGS. 1 and 3, in the present embodiment, the light blocking structure 200 includes an insulating layer 202 and a first reflective layer 204. Each of the sub-pixel regions SP1, SP2, and SP3 is surrounded by the insulating layer 202, and the insulating layer 202 is surrounded by the first reflective layer 204. In some embodiments, the insulating layer 202 may be a single layer or a multilayer structure, and the insulating layer 202 may include materials, for example, titanium dioxide, silicon dioxide, aluminum oxide, or combinations thereof. In some embodiments, the insulating layer 202 has a thickness from 100 angstroms to 30,000 angstroms. In some embodiments, the first reflective layer 204 may include materials, for example, a white glue reflective material. The white glue reflective material may include an inorganic metal oxide, such as titanium dioxide, silicon dioxide, zinc oxide, boron nitride, or combinations thereof. In some embodiments, the first reflective layer 204 may include materials, for example, a black glue reflective material. The black glue reflective material may include materials, for example, carbon-containing organic substance. In some embodiments, the first reflective layer 204 may include a metal reflective material. The metal reflective material may include a metal, an alloy, and combinations thereof. The metal may include aluminum, silver, silver-plated copper, aluminum-plated copper or combinations thereof and the alloy may include an aluminum alloy, a silver alloy or combinations thereof. In some embodiments, the first reflective layer 204 has a thickness from 50 angstroms to 500 angstroms.

Referring to FIGS. 1, 2, and 4. In the present embodiment, the light emitting diode chip 100 is formed on a display substrate (not shown) by flip chip method. As a result, the first electrode 108 and the second electrodes 110 are present on one side of the light emitting diode chip 100 relative to the first top surface TS1. Moreover, the pixel structure 10 further includes an encapsulation layer 300, a first electrode extension layer 400, and three second electrode extension layers 500. The first electrode extension layer 400 is electrically connected to the first electrode 108, the three second electrode extension layers 500 are respectively electrically connected to the three second electrodes 110, and the encapsulation layer 300 is located between the light emitting diode chip 100, the first electrode extension layer 400 and the second electrode extension layer 500 to isolate unnecessary electrical connections.

Referring to FIG. 1, the pixel structure 10 further includes L wavelength transfer layers 600. The L wavelength transfer layers 600 are respectively located on the L light emitting surfaces of the K light emitting surfaces, wherein L is a positive integer less than or equal to K. In the present embodiment, for example, K is equal to 3 and L is equal to 2. That is, the pixel structure 10 includes two wavelength transfer layers 600A and 600B. However, the present disclosure is not limited herein, and those skilled in the art may flexibly select the number of the wavelength transfer layer 600 based on actual needs, as long as the number thereof is a positive integer less than or equal to K.

As shown in FIG. 1, the two wavelength transfer layers 600A and 600B are respectively located on the two light emitting surfaces LS2 and LS3 of the three light emitting surfaces LS1, LS2, and LS3, and the two wavelength transfer layers 600A and 600B are excited to generate different light emitting bands. There is no wavelength transfer layer 600 on the light emitting surface LS1. Moreover, the two wavelength transfer layers 600A and 600B respectively have a vertical projection region on the light emitting surfaces LS2 and LS3, and the area of the vertical projection regions respectively correspond to, e.g., equal to, the area of the light emitting surfaces LS2 and LS3. By the arrangement of the wavelength transfer layers 600A and 600B, part of the light emitted by the light emitting surfaces LS2 and LS3 may generate light of different wavelengths from the original light by the effect of the wavelength transfer layers 600A and 600B, respectively, thereby causing the pixel structure 10 to achieve the desired color of light.

In some embodiments, the wavelength transfer layer 600 may include an organic material or an inorganic material. The organic material may include materials, for example, fluorescent colorants or a fluorescent polymer. The inorganic material may include materials, for example, phosphor material or quantum dots material. In some embodiments, the thickness of the wavelength transfer layer 600 may be, for example, 1 to 100 μm.

Referring to FIG. 1, the pixel structure 10 further includes a spacer 700. The spacer 700 is located between the wavelength transfer layers 600A and 600B. Furthermore, spacers 700 may be located on the sides of the wavelength transfer layers 600A and 600B to prevent the light emitted between the wavelength transfer layers 600A and 600B from interfering with each other. In some embodiments, the spacer 700 may include materials, for example, a white glue or a black glue.

The pixel structure 10 of the present disclosure is composed of a light emitting diode chip 100 and a wavelength transfer layer 600. In contrast to the pixel structure of the conventional RGB multi-chip module, the present disclosure is a single chip module which can improve the yield of chip cutting and die bonding, and also avoid the problem of light reabsorption between multiple chips. Moreover, as shown in FIGS. 1, 2, and 4, since the different sub-pixel regions SP1, SP2, and SP3 share the P-type semiconductor layer 102 as their common electrode, the bottom portion of the pixel structure 10 may form a large-area first electrode 108, so that not only increase the uniformity of the currents but also achieve better heat dissipation.

Figure 5:
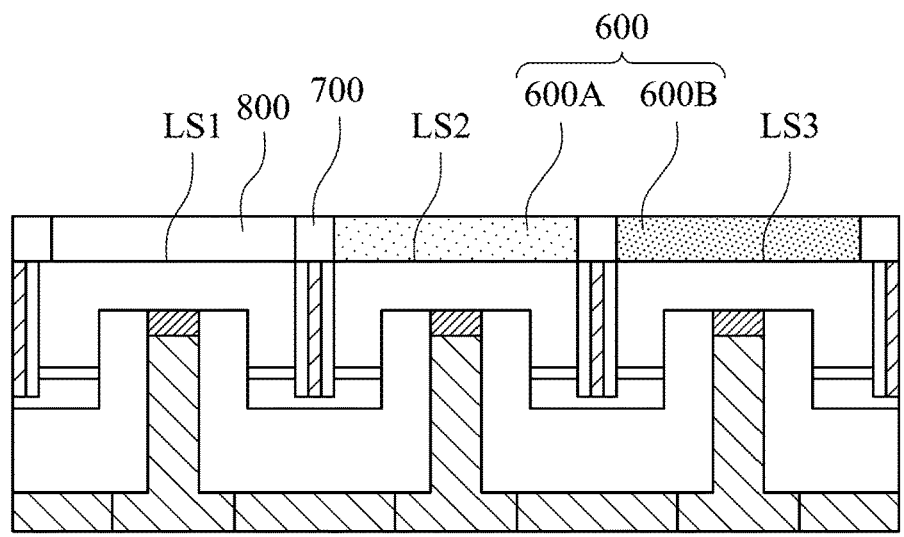
FIG. 5 is a front view of a pixel structure in accordance with another embodiment of the present disclosure.

FIG. 5 is a front view of a pixel structure 10A in accordance with another embodiment of the present disclosure. The pixel structure 10A of the present embodiment is similar to the pixel structure 10, while the difference between pixel structure 10A and the pixel structure 10 is that the transparent adhesive 800 is located on the light emitting surface LS1 that does not have any of the wavelength transfer layers 600.

In the present embodiment, the pixel structure 10A further includes a transparent adhesive 800 located on the light emitting surface LS1 that does not have any of the wavelength transfer layer 600. In this way, the pixel structure 10A may not only provide protection of the light emitting surface LS1 but also improve the light extraction efficiency of the light emitting surface LS1.

Figure 6:
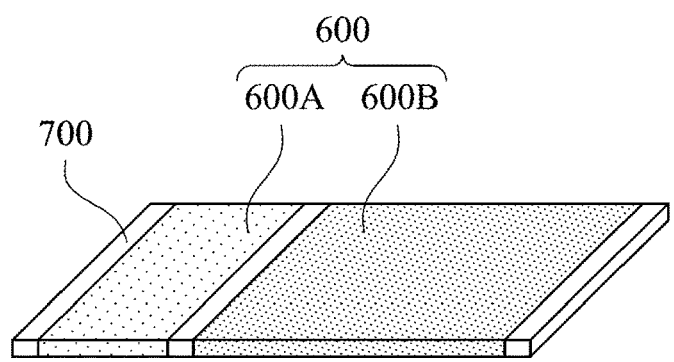
FIG. 6 is a perspective view of a pixel structure in accordance with another embodiment of the present disclosure.
Figure 6:
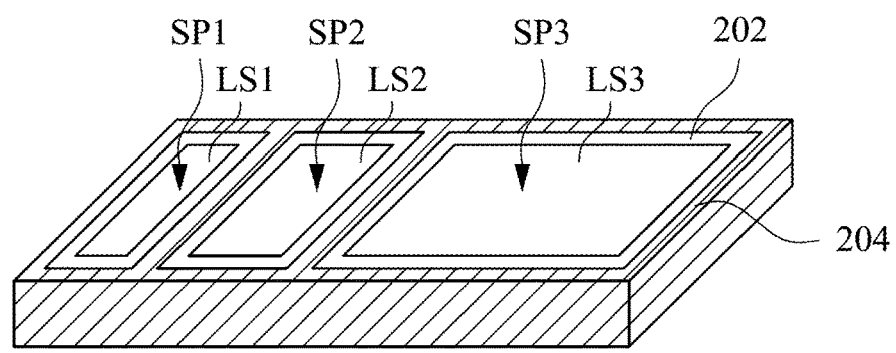

FIG. 6 is a perspective view of a pixel structure 10B in accordance with another embodiment of the present disclosure. The pixel structure 10B of the present embodiment is similar to the pixel structure 10, while the difference between the pixel structure 10B and the pixel structure 10 is that at least two of the three light emitting surfaces LS1, LS2, and LS3 have different areas.

Generally, since different wavelength transfer layers 600 may include different wavelength transfer materials which have different wavelength transfer efficiencies, it is usually required to provide different operating currents for different sub-pixel regions SP1, SP2, and SP3 to achieve the desired color point for the pixel structure. However, differences of different currents density may cause local heat concentration problem. As a result, the problem may be improved by changing the light emitting area of the light emitting surface of different colors. For example, at least two of the three light emitting surfaces LS1, LS2, and LS3 may be designed to have different areas to obtain currents balance among the sub-pixel regions SP1, SP2, and SP3.

As shown in FIG. 6, in the present embodiment, the three light emitting surfaces LS1, LS2, and LS3 respectively have different areas, and the area from small to large is the light emitting surface LS1, the light emitting surface LS2, and the light emitting surface LS3. By changing the area of the light emitting surfaces LS1, LS2, and LS3 of the different sub-pixel regions SP1, SP2, and SP3, the operating currents passing through the different sub-pixel regions SP1, SP2, and SP3 may be adjusted.

Table 1 shows the area relationship between different applications and different standard when the sub-pixel regions SP1, SP2, and SP3 are respectively blue, green, and red.

TABLE 1

|  |  | Application | | | |
|---|---|---|---|---|---|
|  |  | Television | | Display | |
|  |  | NTSC 72 | REC2020 95% | NTSC 72 | REC2020 95% |
| Area | Blue | 100% | 100% | 100% | 100% |
|  | Green | 130~350% | 150~400% | 180~470% | 200~550% |
|  | Red | 80~190% | 300~800% | 130~320% | 500~1000% |

As shown in Table 1, in some embodiments, the area of the blue light emitting surface SP1 is the smallest, the area of the green light emitting surface SP2 is the second smallest, and the area of the red light emitting surface SP3 is the largest for the purpose of achieving uniform currents. For example, as shown in Table 1, when the application is a television, and the standard is NTSC 72, take the area of the blue light emitting surface SP1 as a reference. That is, when the area of the blue light emitting surface SP1 is 100%, the area of the green light emitting surface SP2 is from 130 to 350%, and the area of the red light emitting surface SP3 is from 80 to 190%.

Referring to FIGS. 1, 2, and 6, in some embodiments, currents passing through the first electrode 108 and any of the second electrodes 110 are the same. In some embodiments, voltages between the first electrode 108 and any of the second electrodes 110 are the same.

Figure 7:
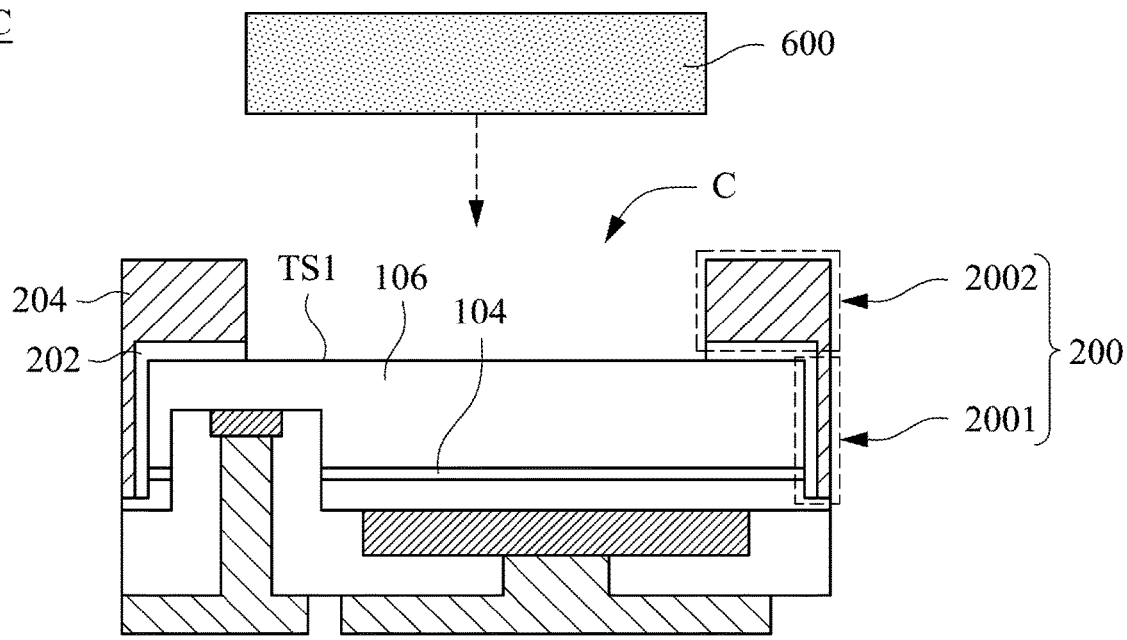
FIG. 7 is a side view of a pixel structure in accordance with another embodiment of the present disclosure.

FIG. 7 is a side view of a pixel structure 10C in accordance with another embodiment of the present disclosure. The pixel structure 10C of the present embodiment is similar to the pixel structure 10, while the difference between the pixel structure 10C and the pixel structure 10 is that the light blocking structure 200 includes a first portion 2001 and a second portion 2002.

As shown in FIG. 7, the light blocking structure 200 includes the first portion 2001 and the second portion 2002 which are coupled with each other. The first portion 2001 is embedded in the N-type semiconductor layer 106 and the active layer 104 under the first top surface TS1. The second portion 2002 protrudes from the first portion 2001 and above the first top surface TS1 such that the second portion 2002 covers on the first top surface TS1 to define at least L accommodating spaces C, and the L wavelength transfer layers 600 are respectively located in the accommodating spaces C. In other words, in the present embodiment, the spacer 700 is not required to be located, but the accommodating space C is formed on the first top surface TS1 through the thickening process of the light blocking structure 200 to accommodate the wavelength transfer layer 600. The effect of avoiding light emitted between the wavelength transfer layers 600 from interfering with each other is achieved by the second portion 2002 of the light blocking structure 200.

Figure 8:
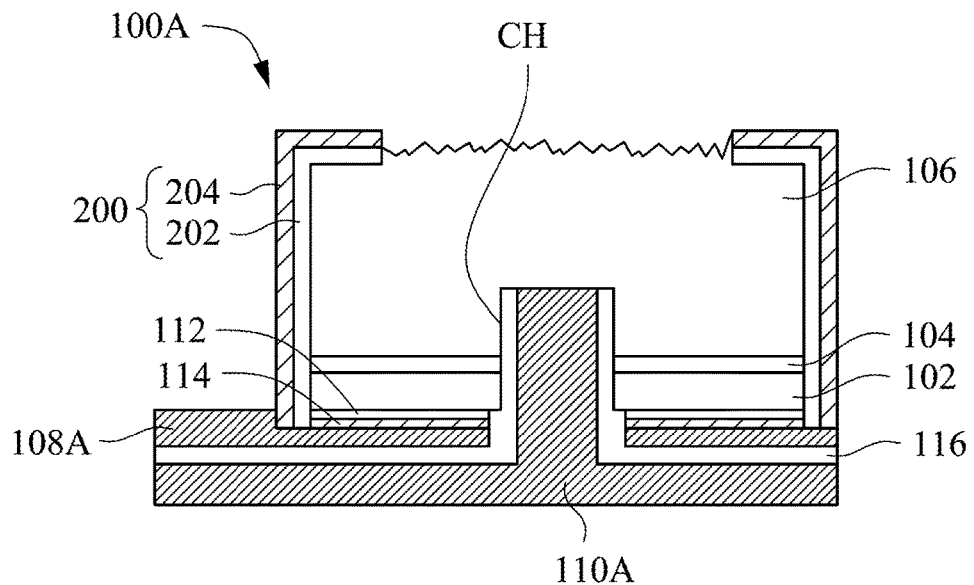
FIG. 8 is a side view of a pixel structure in accordance with another embodiment of the present disclosure.

FIG. 8 is a side view of a pixel structure 10D in accordance with another embodiment of the present disclosure. The pixel structure 10D of the present embodiment is similar to the pixel structure 10, while the difference between the pixel structure 10D and the pixel structure 10 is that the light emitting diode chip 100A is formed on a display substrate (not shown) by non-flip chip method.

As shown in FIG. 8, in the present embodiment, the light emitting diode chip 100A includes a P-type semiconductor layer 102, an active layer 104, an N-type semiconductor layer 106, a first electrode 108A, a second electrode 110A, a transparent conductive layer 112, and a second reflective layer 114. The active layer 104 is located on the P-type semiconductor layer 102. The N-type semiconductor layer 106 is located on the active layer 104. The first electrode 108A is electrically connected to the P-type semiconductor layer 102. The second electrode 110A is electrically connected to the N-type semiconductor layer 106 through a contact hole CH in the light emitting diode chip 100A. The light blocking structure 200 is located in the light emitting diode chip 100A. The second reflective layer 114 is located on the first electrode 108A to reflect the light emitted by the active layer 104. Moreover, since the material used in the second reflective layer 114 is partially easily diffused (for example, silver), the transparent conductive layer 112 is located between the P-type semiconductor layer 102 and the second reflective layer 114 to prevent the second reflective layer 114 from diffusing to the P-type semiconductor layer 102. In some embodiments, the second reflective layer 114 may include materials, for example, gold, aluminum, ruthenium, silver, nickel, chromium, or an alloy thereof. In some embodiments, the transparent conductive layer 112 may include materials, for example, indium tin oxide, zinc aluminum oxide, zinc aluminum gallium oxide, indium gallium zinc oxide, or thin metal.

A protective layer 116 is located between the second electrode 110A and the active layer 104, the P-type semiconductor layer 102, the transparent conductive layer 112, the second reflective layer 114, and the first electrode 108A, such that the second electrode 110A can be insulated to the active layer 104, the P-type semiconductor layer 102, the transparent conductive layer 112, the second reflective layer 114, and the first electrode 108A.

Figure 9A:
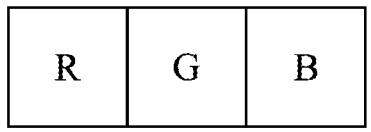
FIGS. 9A to 9E are schematic views illustrating the arrangement of sub-pixel regions in accordance with various embodiments of the present disclosure.
Figure 9B:
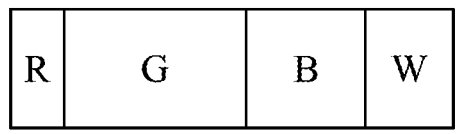
Figure 9D:
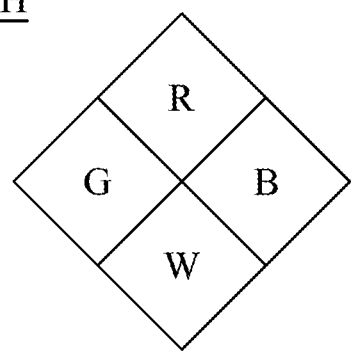
Figure 9C:
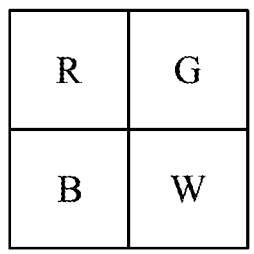
Figure 9E:
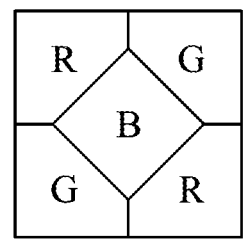

FIGS. 9A to 9E are schematic views illustrating the arrangement of sub-pixel regions in accordance with various embodiments of the present disclosure. In some embodiments, the sub-pixel regions are arranged in a strip form, a PenTile form, a rectangle form or a diamond form. In some embodiments, the area of different sub-pixel regions may be different. As shown in FIG. 9A, the sub-pixel regions in the pixel structure 10E are arranged in, for example, a strip form. As shown in FIG. 9B, the sub-pixel regions in the pixel structure 10F are arranged in, for example, a strip form, and the area of the different sub-pixel regions may be different. As shown in FIG. 9C, the sub-pixel regions in the pixel structure 10G are arranged in, for example, a rectangle form. As shown in FIG. 9D, the sub-pixel regions in the pixel structure 10H are arranged in, for example, a diamond form. As shown in FIG. 9E, the sub-pixel regions in the pixel structure 10I are arranged in, for example, a PenTile form.

From the above detailed description of the specific embodiments of the present disclosure, it is clear that the pixel structure of the present disclosure is composed of a light emitting diode chip and a wavelength transfer layer. In contrast to the pixel structure of the conventional RGB multi-chip module, the pixel structure of the present disclosure is a single chip module which can improve the yield of chip cutting and die bonding, and also avoid the problem of light reabsorption between multiple chips.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A pixel structure, comprising:
   a light emitting diode chip, comprising:
   a P-type semiconductor layer;
   an active layer disposed on the P-type semiconductor layer;
   a N-type semiconductor layer disposed on the active layer, wherein the N-type semiconductor layer has a first top surface that is distant from the active layer;
   a first electrode electrically connected to the P-type semiconductor layer; and
   K second electrodes, wherein K is a positive integer greater than or equal to 3; and
   a light blocking structure disposed in the light emitting diode chip and defining K sub-pixel regions, wherein the active layer and the N-type semiconductor layer are divided into K sub-portions respectively corresponding to the K sub-pixel regions by the light blocking structure, the K sub-pixel regions share the P-type semiconductor layer, the K second electrodes are respectively electrically connected to the K sub-portions of the N-type semiconductor layer, and the first top surface is divided into K light emitting surfaces corresponding to the K sub-pixel regions by the light blocking structure, wherein the P-type semiconductor layer has a first bottom surface that is distant from the first top surface, the active layer has a second bottom surface that is distant from the first top surface, and the light blocking structure has a third bottom surface between the first bottom surface and the second bottom surface.

2. The pixel structure of claim 1, wherein the light blocking structure further has a second top surface that is distant from the P-type semiconductor layer, and wherein the second top surface is not lower than the first top surface.

3. The pixel structure of claim 2, wherein the light blocking structure extends from the third bottom surface to the second top surface.

4. The pixel structure of claim 1, wherein the first electrode and the K second electrodes are present on one side of the light emitting diode chip relative to the first top surface.

5. The pixel structure of claim 1, wherein currents passing through the first electrode and any of the K second electrodes are the same.

6. The pixel structure of claim 1, wherein voltages between the first electrode and any of the K second electrodes are the same.

7. The pixel structure of claim 1, further comprising:
   L wavelength transfer layers respectively disposed on L light emitting surfaces of the K light emitting surfaces, wherein L is a positive integer less than or equal to K.

8. The pixel structure of claim 7, wherein at least two of the L wavelength transfer layers are excited to generate different light emitting bands.

9. The pixel structure of claim 7, wherein L is a positive integer less than K such that at least one of the K light emitting surfaces does not have any of the L wavelength transfer layers.

10. The pixel structure of claim 9, further comprising:
    a transparent adhesive disposed on the light emitting surface that does not have any of the L wavelength transfer layers.

11. The pixel structure of claim 7, wherein the L wavelength transfer layers respectively have a vertical projection region on the L light emitting surfaces, and area of the vertical projection regions respectively correspond to area of the L light emitting surfaces.

12. The pixel structure of claim 11, further comprising:
    at least one spacer disposed between the L wavelength transfer layers.

13. The pixel structure of claim 7, wherein the light blocking structure comprises:
    a first portion embedded in the N-type semiconductor layer and the active layer under the first top surface; and
    a second portion covering the first top surface to define at least L accommodating spaces, and the L wavelength transfer layers respectively disposed in the L accommodating spaces.

14. The pixel structure of claim 13, wherein the second portion protrudes above the first top surface.

15. The pixel structure of claim 1, wherein at least two of the K light emitting surfaces have different areas.

16. A pixel structure, comprising:
    a light emitting diode chip, comprising:
    a P-type semiconductor layer;
    an active layer disposed on the P-type semiconductor layer;
    a N-type semiconductor layer disposed on the active layer, wherein the N-type semiconductor layer has a first top surface that is distant from the active layer;
    a first electrode electrically connected to the P-type semiconductor layer; and
    K second electrodes, wherein K is a positive integer greater than or equal to 3; and
    a light blocking structure disposed in the light emitting diode chip and defining K sub-pixel regions, wherein the active layer and the N-type semiconductor layer are divided into K sub-portions respectively corresponding to the K sub-pixel regions by the light blocking structure, the K sub-pixel regions share the P-type semiconductor layer, the K second electrodes are respectively electrically connected to the K sub-portions of the N-type semiconductor layer, and the first top surface is divided into K light emitting surfaces corresponding to the K sub-pixel regions by the light blocking structure, wherein the light blocking structure comprises an insulating layer and a reflective layer.

17. The pixel structure of claim 16, wherein the reflective layer comprises a white glue reflective material comprising titanium dioxide, silicon dioxide, zinc oxide, boron nitride or combinations thereof.

18. The pixel structure of claim 16, wherein the reflective layer comprises a metal reflective material comprising aluminum, silver, silver-plated copper, aluminum-plated copper or combinations thereof.

19. The pixel structure of claim 16, wherein the K sub-pixel regions are arranged in a strip form, a rectangle form or a diamond form.

* * * * *